(12) United States Patent
Dubreuil

(10) Patent No.: US 8,927,052 B2
(45) Date of Patent: Jan. 6, 2015

(54) PROCESS FOR DEPOSITION AND CHARACTERIZATION OF A COATING

(71) Applicant: Vito NV, Mol (BE)

(72) Inventor: Marjorie Dubreuil, Lummen (BE)

(73) Assignee: Vito NV, Mol (BE)

( * ) Notice: Subject to any disclaimer, the term of this patent is extended or adjusted under 35 U.S.C. 154(b) by 8 days.

(21) Appl. No.: 13/902,064

(22) Filed: May 24, 2013

(65) Prior Publication Data

US 2013/0313480 A1    Nov. 28, 2013

(30) Foreign Application Priority Data

May 24, 2012  (EP) ..................... 12169317
Dec. 21, 2012  (EP) ..................... 12198840

(51) Int. Cl.
| | | |
|---|---|---|
| C23C 16/00 | (2006.01) | |
| B05D 1/00 | (2006.01) | |
| C23C 16/30 | (2006.01) | |
| C23C 16/448 | (2006.01) | |
| C23C 16/52 | (2006.01) | |
| C23C 16/54 | (2006.01) | |
| H01J 37/32 | (2006.01) | |
| H05H 1/24 | (2006.01) | |
| B05D 7/04 | (2006.01) | |
| B05D 5/06 | (2006.01) | |

(52) U.S. Cl.
CPC ............... *B05D 1/62* (2013.01); *C23C 16/006* (2013.01); *C23C 16/30* (2013.01); *C23C 16/4486* (2013.01); *C23C 16/52* (2013.01); *C23C 16/54* (2013.01); *H01J 37/32935* (2013.01); *H01J 37/32972* (2013.01); *H05H 1/2406* (2013.01); *B05D 7/04* (2013.01); *H05H 2001/2412* (2013.01); *B05D 5/06* (2013.01); *B05D 2252/02* (2013.01)
USPC .................................. 427/8; 427/10; 427/569

(58) Field of Classification Search
None
See application file for complete search history.

(56) References Cited

U.S. PATENT DOCUMENTS

| | | | |
|---|---|---|---|
| 5,270,116 A | 12/1993 | Melancon et al. | |
| 2005/0073673 A1* | 4/2005 | Devitt et al. ..................... | 356/37 |
| 2006/0083860 A1* | 4/2006 | Holzapfel et al. ............. | 427/402 |
| 2008/0171344 A1* | 7/2008 | Kapsner ......................... | 435/7.4 |
| 2009/0072233 A1* | 3/2009 | Hayashi et al. ................. | 257/43 |
| 2009/0162533 A1* | 6/2009 | Kirby et al. ...................... | 427/8 |
| 2009/0162644 A1 | 6/2009 | Ricks | |

FOREIGN PATENT DOCUMENTS

| | | |
|---|---|---|
| DE | 10-2011-007349 A1 | 10/2012 |
| EP | 0414562 A2 | 2/1991 |
| EP | 0449291 A2 | 10/1991 |
| EP | 1643005 A2 | 4/2006 |
| EP | 1785198 A1 | 5/2007 |
| GB | 2455849 A | 6/2009 |

* cited by examiner

*Primary Examiner* — Joseph Miller, Jr.
(74) *Attorney, Agent, or Firm* — Knobbe, Martens, Olson & Bear LLP

(57) ABSTRACT

Provided herein are processes for depositing a plasma coating on a substrate and coated substrates obtained thereby. More particularly, processes for characterizing a plasma coating on a substrate are provided. The process for depositing a plasma coating includes the step of exposing the substrate to a plasma. The plasma includes at least one coating precursor and one fluorophore other than the coating precursor.

14 Claims, 2 Drawing Sheets

A

B

PROCESS FOR DEPOSITION AND CHARACTERIZATION OF A COATING

The work leading to the subject of this patent application has received funding from the European Union Seventh Framework Programme (FP7/2007-2011) under grant agreement n° 211473.

FIELD OF THE INVENTION

The present application relates to processes for depositing a plasma coating on a substrate and coated substrates obtained thereby. The application further relates to processes for the in-line characterization of a plasma coating on a substrate.

BACKGROUND OF THE INVENTION

Plasma deposition is a coating method wherein thin films are deposited from a gas, aerosol, liquid or vapor state to a solid state on a substrate, and may be used for coating virtually any substrate with a vast choice of coatings. Unlike other coating techniques such as chemical vapor deposition (CVD) and physical vapor deposition (PVD) which are limited to batch processes, plasma deposition is suitable for use in continuous coating processes, and therefore highly attractive for industrial applications.

However, as the coatings obtained by plasma deposition often only have a thickness of a few nanometers, the in-line characterization of such coatings in an industrial process remains a challenge. Yet, the detection of small deviations of the coating quality is of high importance for timely adjustment of the coating process, such that larger production errors can be avoided.

Currently, various techniques are available for coating characterization in general, including such techniques as x-ray photoelectron spectroscopy (XPS), scanning electron microscopy (SEM), energy-dispersive x-ray analysis (EDX), profilometry, contact angle measurement, Fourier transform infrared spectroscopy (FTIR), broadband optical monitoring (BOM), and atomic force microscopy (AFM). Although these techniques may allow the accurate determination of one or more aspects of the coating such as thickness, chemical composition, hydrophilicity or hydrophobicity, and roughness, they are not suitable for the in-line monitoring of continuous coating processes.

Accordingly, there is a need for improved processes which allow the characterization of coatings obtained by plasma deposition.

Patent application GB2455849 describes plasma spray deposition of barrier coatings comprising rare earth elements as taggants. Using a high temperature plasma gas stream, high melting point materials such as metals are sprayed onto a work piece. EP1643005 describes vacuum plasma deposition which is a batch process. Dye molecules are used to for applications in opto- and microelectronics.

SUMMARY OF THE INVENTION

Provided herein are processes for depositing a plasma coating on a substrate and coated substrates obtained thereby. Further provided herein are processes for characterizing a plasma coating on a substrate, more particularly for the in-line characterization of a plasma coating on a substrate.

It has surprisingly been found that fluorophores can be incorporated in plasma coatings, without significant loss of their fluorescent properties. Furthermore, it has been found that plasma coatings comprising such fluorophores may be characterized by monitoring of the fluorescence of the fluorophores. Accordingly, in a first aspect, a process is provided, more particularly an in-line process, for characterizing a plasma coating on a substrate. The present process typically comprises incorporating a fluorophore in the plasma coating, and characterizing said plasma coating in-line by monitoring of the fluorescence of said fluorophore. In particular embodiments, the fluorophore is incorporated during the plasma coating process.

In particular embodiments, the process is an in-line process which comprises the steps of:
 a) exposing the substrate to a non-thermal plasma (or an afterglow region of said plasma), said plasma (or afterglow) comprising at least one coating precursor and one fluorophore other than the coating precursor, thereby obtaining a coated substrate wherein the coating of the coated substrate comprises the fluorophore;
 b) irradiating the coated substrate in-line with electromagnetic radiation suitable for exciting the fluorophore; and
 c) monitoring the light emitted from the fluorophore present in the coating in-line with the coating process so as to characterize the coating.

In particular embodiments, the process is a continuous process. In certain embodiments, the substrate moves through said plasma or afterglow at a speed up to 500 meter per minute.

In certain embodiments, the coating precursor and fluorophore are comprised in a solution, the solution being introduced into the plasma (or afterglow) in the form of an aerosol together with a carrier gas. In further embodiments, the solution comprises the fluorophore in a concentration ranging between 10% and 100% of the concentration at saturation.

In particular embodiments, the fluorophore is selected from a fluorescent protein, a xanthene derivative, a cyanine derivative, anthracene or an anthracene derivative, napththalene or a naphthalene derivative, coumarin or a coumarin derivative, an oxadiazole derivative, a pyrene derivative, an oxazine derivative, an acridine derivative, an arylmethine derivative, a tetrapyrrole derivative, and a diene derivative.

In certain embodiments, the envisged process further comprises an activation step prior to step a). This activation step comprises the introduction of the substrate in a plasma (or in an afterglow region thereof), said plasma (or afterglow) not comprising the coating precursor and fluorophore.

In particular embodiments, the plasma is maintained at a pressure between 10 kPa to 1 MPa. In certain embodiments, the plasma is a dielectric barrier discharge generated and maintained in the volumetric space between a first and second electrode by applying an alternating voltage to said first and second electrode.

In certain embodiments, the electromagnetic radiation has one or more wavelengths between 100 and 800 nm. In certain embodiments, the light emitted from the fluorophore is monitored visually or measured quantitatively. In particular embodiments, step c) of the present method comprises characterizing at least one property of said coating selected from the coating thickness and coating homogeneity.

In a further aspect, a coated substrate obtained or obtainable by the process described herein is provided. More particularly, the coated substrate is characterized in that the coating is a plasma coating and comprises a fluorophore.

In a further aspect, the use of a fluorophore for in-line characterization of a coating obtained by plasma deposition is provided.

In addition, a process for deposition of a plasma coating on a substrate is provided, comprising the step of exposing said substrate to a non-thermal plasma or an afterglow region of said plasma comprising at least one coating precursor and one fluorophore other than said coating precursor, thereby obtaining a coated substrate wherein the coating of said coated substrate comprises said fluorophore.

BRIEF DESCRIPTION OF THE DRAWINGS

The following description of the figures of specific embodiments is merely exemplary in nature and is not intended to limit the present teachings, their application or uses. Throughout the drawings, corresponding reference numerals indicate like or corresponding parts and features.

In the figures, the following numbering is used.

Figure 1:
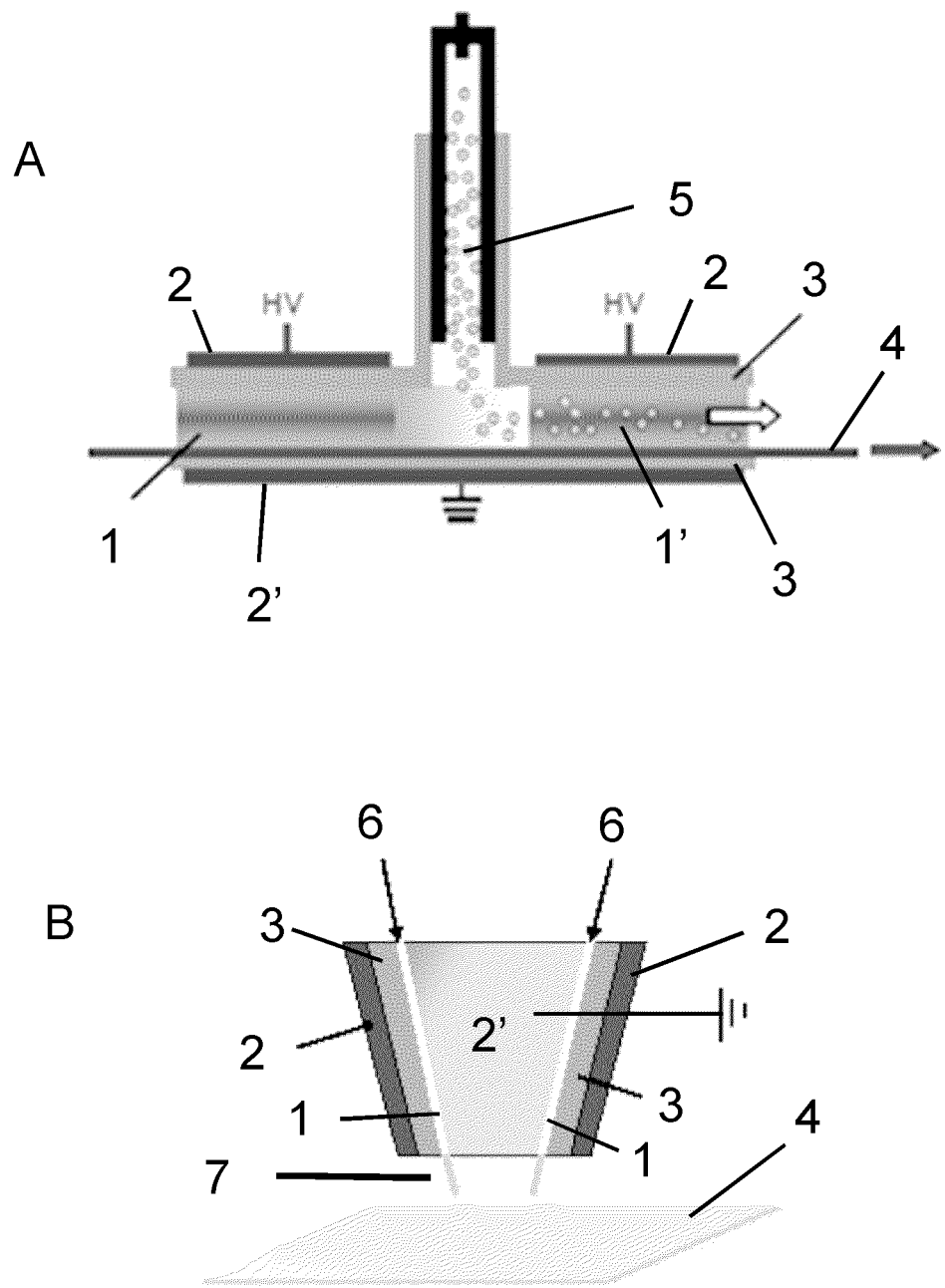
FIG. 1A, B: illustrations of exemplary DBD setups suitable for use in the processes described herein.

1—plasma; 1'—plasma comprising a precursor; 2—high voltage electrode, 2'—grounded electrode; 3—dielectric; 4—substrate; 5—gas flow comprising aerosol particles; 6—plasma gas; 7—plasma afterglow.

DETAILED DESCRIPTION OF THE INVENTION

The methods and products will be described with respect to particular embodiments but the teaching is not limited thereto but only by the claims. Any reference signs in the claims shall not be construed as limiting the scope thereof.

As used herein, the singular forms "a", "an", and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps. The terms "comprising", "comprises" and "comprised of" when referring to recited components, elements or method steps also include embodiments which "consist of" said recited components, elements or method steps.

Furthermore, the terms "first", "second", "third" and the "like" in the description and in the claims, are used for distinguishing between similar elements and not necessarily for describing a sequential or chronological order, unless specified. It is to be understood that the terms so used are interchangeable under appropriate circumstances and that the embodiments described herein are capable of operation in other sequences than described or illustrated herein.

Reference throughout this specification to "one embodiment" or "an embodiment" means that a particular feature, structure or characteristic described in connection with the embodiment is included in at least one embodiment of the methods, products or apparatuses envisaged herein. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the invention, and form different embodiments, as would be understood by those in the art. For example, in the appended claims, any of the features of the claimed embodiments can be used in any combination.

The values as used herein when referring to a measurable value such as a parameter, an amount, a temporal duration, and the like, is meant to encompass variations of +/−10% or less, preferably +/−5% or less, more preferably +/−1% or less, and still more preferably +/−0.1% or less of and from the specified value, insofar such variations are appropriate in the context of the methods and products described herein. It is to be understood that each value as used herein is itself also specifically, and preferably, disclosed.

The recitation of numerical ranges by endpoints includes all numbers and fractions subsumed within the respective ranges, as well as the recited endpoints.

All documents cited in the present specification are hereby incorporated by reference in their entirety.

Unless otherwise defined, all terms used in disclosing the processes and products provided herein, including technical and scientific terms, have the meaning as commonly understood by one of ordinary skill in the art to which this disclosure belongs. By means of further guidance, definitions for the terms used in the description are included to better appreciate the teaching provided herein. The terms or definitions used herein are provided solely to aid in the understanding of the teaching.

Provided herein are processes for depositing a plasma coating on a substrate and coated substrates obtained by these processes. Also provided are processes for characterizing a plasma coating on a substrate. The term "plasma" as used herein refers to a state of matter similar to gas in which a certain portion of the particles are ionized. The plasma may include reactive species such as electrons, ions, neutral molecules, free radicals, and other excited state atoms and molecules.

The term "non-thermal plasma" as used herein refers to a plasma which is not in thermodynamic equilibrium, more particularly because the (kinetic) temperature of ions, atoms and/or molecules in the plasma is much lower than the electron temperature. Typically, the temperature of ions, atoms and/or molecules in the plasma is below 1000° C., more particularly below 400° C., for example close to room temperature (about 20° C.). On the other hand, the (kinetic) temperature of electrons in the plasma typically is about several thousands ° C., for example 10.000° C. or more.

The term "plasma coating" as used herein refers to a coating which is obtained via a plasma treatment or a plasma deposition process, i.e. a process in which a coating is deposited on a surface via a plasma or an afterglow region thereof. More particularly, the deposition of a plasma coating is based on the formation of reactive species in the plasma (and/or afterglow region thereof)—through for instance fragmentation reactions—said reactive species inducing reactions (e.g. polymerization) of coating precursors which are introduced in the plasma (and/or afterglow thereof), resulting in the deposition of a coating on a substrate which is positioned in the plasma (or afterglow region thereof).

Thus, the processes for depositing a plasma coating on a substrate described herein differ from techniques such as plasma spray deposition, wherein coating materials are heated in a plasma and sprayed onto a substrate. In thermal spraying techniques, the plasma is used for melting inorganic coating materials, wherein the coating materials are deposited as such, without significant reaction of or between the coating materials.

The plasma coating processes envisaged herein typically involve plasma polymerization, i.e. polymerization of coating precursors which are introduced into the plasma or the afterglow region thereof. The coating precursors preferably are organic or hybrid organic-inorganic gaseous, liquid or solid chemicals. Examples of suitable coating precursors are detailed herein below.

The process of depositing a plasma coating is also referred to herein as "plasma deposition".

The term "coating" as used herein refers to a covering that is applied to the surface of an object, usually referred to as "substrate". Coatings may be applied to improve one or more surface properties of the substrate, including but not limited to adhesion, wettability, corrosion resistance, wear resistance, and scratch resistance. The term "coating" as used herein may also refer to a number of molecules which are grafted (e.g. covalently attached) onto the substrate surface. The substrate surface may be fully saturated with the grafted molecules (i.e., no more molecules can be grafted directly onto the substrate surface), or only partially, for example at least 10, 20, 30, 50, 70 or 90% saturation. As indicated above, when referring to a coating on a substrate this includes processes wherein the entire surface of the substrate is covered or only selected parts thereof.

It has been found that fluorophores such as fluorescent dyes and uv-active compounds can be incorporated in plasma coatings without significant loss of their fluorescence. Plasma coatings comprising such fluorophores may be characterized by monitoring of the fluorescence of the fluorophores. This allows for a reliable in-line characterization of plasma coatings in coating processes on an industrial scale.

Accordingly, in a first aspect, processes are provided for deposition of a plasma coating on a substrate. The processes comprise the step of exposing the substrate to a non-thermal plasma or an afterglow region thereof, whereby the plasma (or afterglow thereof) comprises one or more coating precursors and one or more fluorophores other than the coating precursor(s). Thus, the processes as envisaged herein involve the deposition of a plasma coating.

A plasma typically comprises reactive species such as ions, electrons, radicals, etc. The reactive species induce reactions (e.g. polymerization) of coating precursors which are introduced in the plasma (or afterglow thereof), which results in the deposition of a coating on a substrate which is positioned in the plasma (or afterglow thereof).

In the methods for deposition and/or characterization of a plasma coating envisaged herein, the nature of the plasma coating is not critical. Thus, the different parameters of the plasma deposition may vary. These different parameters are discussed more in detail below.

In the methods involving plasma deposition envisaged herein, the plasma is a non-thermal plasma, also known as "cold plasma". This is a plasma wherein the atoms and molecules of the processing gas and coating precursors typically attain much lower temperatures (generally between 25 and 400° C.) than the temperature of the electrons, which may have a temperature of several thousands ° C. Accordingly, the temperature in non-thermal plasmas is considerably lower than the temperature in plasmas used for thermal spraying processes, e.g. plasma spray coating, wherein the temperature in the plasma is typically between 2.000° C. and 10.000° C. Non-thermal plasmas are particularly suitable for the deposition of coatings from organic precursors, and/or the deposition of coatings comprising organic fluorophores.

Non-thermal plasmas are typically generated by accelerating free electrons to high velocities by an oscillating electromagnetic field that excites gas atoms. In particular embodiments, the non-thermal plasma is a dielectric barrier discharge (DBD). However, it is also envisaged that other techniques for generating an (atmospheric pressure) plasma may be used, for example a radiofrequency or microwave glow discharge, a pulsed discharge or a plasma jet. A DBD is typically generated and maintained in the volumetric space between a first and second electrode by applying an alternating voltage to said first and second electrode. The first and second electrodes are typically separated by an insulating dielectric barrier, for example comprising or consisting of glass, quartz or a ceramic material. One or both electrodes may be covered by such a dielectric barrier.

The electrodes may be asymmetric, meaning that they are of different size, shape, surface area, etc., and need not necessarily be parallel to each other. However, in certain embodiments, the electrodes may be parallel and/or have a similar size, shape, surface area, etc. In particular embodiments, the volumetric space (gap) between both electrodes (i.e. between dielectric layers or between a dielectric layer and an electrode) has an (average) width of less than 5 mm, more particularly between 1 and 5 mm, for example about 2 mm.

The frequency of the alternating voltage, herein also referred to as "frequency", of the plasma coating in the methods envisaged herein typically ranges between 1 and 100 kHz, more particularly between 1 and 50 kHz, more particularly below 40 kHz. It has now been found that above a certain threshold, an increasing frequency typically results in a lower coating homogeneity. The methods for coating and/or characterizing a coating may be of particular interest for use in methods wherein the coating homogeneity is a potential issue. Accordingly, in particular embodiments, the frequency is between 1 and 10 kHz. However, in the methods envisaged herein, higher frequencies are also envisaged. The voltage applied between the electrodes typically ranges between 1 and 200 kV. The optimal voltage may depend on the applied frequency.

The applied power influences the fraction of coating precursors that are converted to a coating. At a lower power, lower fractions of the precursors are converted to the reactive species required for obtaining a good quality coating. Typically, the power is above 0.2 W/cm$^2$ electrode surface, but not higher than 10 W/cm$^2$, more particularly between 0.2 and 2 W/cm$^2$, for example between 0.4 and 1 W/cm$^2$.

The plasma is typically generated and maintained in the presence of a gas. In case of a DBD, the gas is usually introduced in the volumetric space between the electrodes. In particular embodiments, the gas is selected from $N_2$, Ar, He, $CO_2$, $O_2$, $N_2O$, or a mixture of two or more of these gases. Preferably, a steady gas flow is maintained between the electrodes. In particular embodiments, the total gas flow is comprised between 1 and 100 slm (standard liter per minute), more particularly between 1 and 40 slm, most particularly between 10 and 40 slm.

Unlike other coating techniques such as CVD and PVD, plasma deposition techniques are not limited to batch processes. Moreover, a plasma such as a DBD may be generated and maintained at atmospheric pressure. This is particularly advantageous for coating processes on an industrial scale. In particular embodiments envisaged herein, the plasma is maintained at a pressure between 10 kPa to 1 MPa, more particularly between 50 kPa and 150 kPa. In further embodiments, the plasma is produced and maintained at or near atmospheric pressure.

The processes as envisaged herein are compatible with a large variety of substrate types. Non-limiting examples of suitable substrate materials include polymers, metals, glass, ceramics, paper, composite materials, textiles and wood. Non-limiting examples of suitable polymers include polyethylene, polypropylene, polystyrene, polycarbonate, polyethylene terephtalate, polybutylene terephtalate, acrylic resins, polyvinyl chloride, polyamide, polysulfone, poly(vinylidene fluorine), poly(tetrafluoroethylene), poly(vinylidene chloride), cellulose, polylactic acid, polycaprolactone, polycaprolactam, polyethylene glycol and mixtures or copolymers thereof.

In the methods envisaged herein, the substrate is exposed to the plasma or plasma afterglow comprising the coating precursor(s) and one or more fluorophores. Thus, the substrate may be exposed to the plasma comprising the coating precursor(s) and fluorophore(s), or an afterglow region of said plasma, said afterglow comprising the coating precursor(s) and fluorophore(s). The term "afterglow" as used herein refers to a reactive gas stream resulting from a plasma. In the afterglow of a plasma such as a DBD, the external electromagnetic fields that sustained the plasma glow are absent or insufficient to maintain the discharge. In the afterglow, plasma-generated species de-excite and participate in secondary chemical reactions that tend to form stable species. Typically only neutral species interact with the surface of the exposed substrate in the afterglow. A plasma afterglow can either be a temporal afterglow, due to an interrupted plasma source, or a spatial afterglow, due to a distant plasma source. In the processes described herein, the afterglow typically is a spatial afterglow.

If the plasma is a DBD, the substrate may be exposed to the plasma by introducing the substrate into the volumetric space between the electrodes. Thus, this typically requires thin substrates. However, it is not always needed to position the substrate between the electrodes, for example when the substrate is exposed to an afterglow region of the plasma, the substrate. Some exemplary DBD setups are shown in Example 1.

In particular embodiments, the processes for depositing and/or characterizing a coating described herein may comprise a cleaning and/or activation step, herein also referred to as "activation step", prior to the actual coating of the substrate. The activation step involves the introduction of the substrate in a plasma or in an afterglow region thereof, wherein the plasma does not comprise a coating precursor or fluorophore as described herein. The activation step may be used for cleaning the substrate surface and/or for the production of reactive sites at the substrate surface, and may therefore promote adhesion of the plasma coating on the substrate.

The plasma (or afterglow thereof) used for the coating in the methods described herein comprises one or more coating precursors. In certain embodiments, the plasma (or afterglow) comprises one coating precursor. In particular embodiments, the plasma comprises two, three, four, five or more coating precursors. In the plasma, the coating precursor(s) form(s) reactive species which then form a coating on the substrate positioned in or near the plasma. This differs from thermal spraying techniques such as plasma spray deposition, wherein the plasma is not used for forming reactive species but for melting the materials to be deposited.

Plasma deposition may be used for the deposition of various coating types, and the nature and/or functionality of the coating is not critical for the processes envisaged herein. The coating may be deposited on the substrate for providing one or more functionalities, or for modifying or enhancing one or more (physical) properties of the substrate, for example selected from hydrophilicity, hydrophobicity, oleophilicity, adhesion, gas diffusion barrier properties, liquid diffusion barrier properties, chemical resistance, UV radiation resistance, thermal resistance, flame retardancy, porosity, conductivity, optical properties, self-cleaning properties, acoustic properties, roughness, wear resistance, scratch resistance, lubrication, antibacterial properties, biocompatibility, catalytic properties, antifogging properties, smell, taste, insect repellent properties, allergenic properties, toxicity and acid-base level.

The coating precursors typically are organic or hybrid organic-inorganic gaseous, liquid or solid chemicals. Typically, the coating precursors do not comprise ceramic materials. In particular embodiments of the methods envisaged herein, the one or more coating precursors used are liquid under standard conditions (1 bar and 20° C.). In other embodiments, one or more coating precursors are solid under standard conditions. In those embodiments, the solid coating precursors may be heated to obtain a liquid having an adequate viscosity before introduction of the precursors in the plasma or afterglow. If a coating precursor is a gas, it may be introduced in the plasma or afterglow as such. If the coating precursor(s) comprise a liquid precursor, that precursor may be introduced in the plasma or afterglow as an aerosol together with a carrier gas.

If the precursor is a solid, it is typically dissolved in a solvent which may also be a coating precursor. Then, the solution comprising the precursor may be introduced as an aerosol together with a carrier gas. The introduced solution may also be a dispersion of nanoparticles.

The choice of coating precursor(s) mainly depends on the envisaged type of coating. Suitable precursors for plasma deposition of conjugated polymer coatings are known in the art and are disclosed, i.a. in international patent application WO 2007/053916. As an example, such precursors may include an aromatic heterocycle, a substituted benzene, a polycyclic aromatic compound, or derivatives thereof. Suitable precursors for plasma deposition of hydrophilic coatings are generally known to the skilled person and include those disclosed for instance in international patent application WO 2009/037331. As an example, such precursors may include an acetate such as ethyl acetate, bornyl acetate, 2-ethoxyethyl acetate, 2-methoxyethyl acetate, 2-pentyl acetate, and 4-bromobutyl acetate. Suitable precursors for plasma deposition of an inorganic-organic hybrid polymer material are also known in the art and include organically functionalized alkoxysilanes disclosed, for instance, in international patent application WO 2005/095007. These documents are hereby incorporated by reference.

However, the present methods are not limited to the precursors mentioned in the documents cited above. In certain embodiments of the methods envisaged herein, the one or more coating precursors are selected from the group consisting of aliphatic or aromatic esters, ethers, alkanes, alkenes, alkynes, amines, alcohols, carboxylic acids, halogen compounds, ketones, aldehydes, amides, anhydrides, nitriles, siloxane derivatives, allyl compounds, acrylates, methacrylates, and vinyl derivatives.

In specific embodiments, the one or more coating precursors are selected from the group consisting of ethanol, acrylic acid, 3-glycidoxypropyltrimethoxysilane (GLYMO), acetic acid, hydroxyethylacrylate, allylacrylate, allylamine, ethylacrylate, ethyl acetate and 3-aminopropyltriethoxysilane.

The plasma deposition is typically performed in a dedicated plasma reactor. In particular embodiments, the plasma reactor is a DBD reactor, comprising a set of two or more electrodes, wherein at least one of the electrodes is connected to a power supply. The DBD reactor typically comprises or may be connected to a gas supply unit. The reactor may further comprise or be connected to an aerosol generator. Exemplary plasma reactor setups for plasma deposition are described in Example a). In particular embodiments, the plasma deposition may be performed in two or more dedicated plasma reactors. The plasma reactors may be configured serially such that the substrate(s) can move consecutively through the two or more reactors in an in-line process.

In the processes for coating and/or characterizing a coating as envisaged herein, the plasma (or afterglow thereof) further comprises at least one fluorophore. As the plasma simultaneously comprises one or more coating precursors and one or more fluorophore(s), the fluorophore is incorporated in the coating obtained from the coating precursors. This results in a fluorescent coating, which may be used for characterizing the coating quality (see further).

In certain embodiments, the precursor which is introduced into the plasma (or afterglow thereof) comprises one fluorophore. The term "fluorophore" as used herein refers to a compound, ion or atom which is capable of fluorescing, i.e. absorbing light at one wavelength (herein also referred to "excitation wavelength") and emitting light at another, typically longer, wavelength (herein also referred to "emission wavelength") in response. Typically, the fluorophore may absorb and emit light within certain wavelength ranges. Thus, the excitation wavelength and emission wavelength of a given fluorophore are generally not limited to a single value.

The excitation wavelength typically ranges between 10 and 1000 nm, more particularly between 100 and 800 nm. Thus, the fluorophore may absorb UV, visible and/or infrared light. In particular embodiments, the excitation wavelength ranges between 100 and 400 nm. This means that the fluorophore is not or almost not excited by visible light. Often, such fluorophores do not absorb any visible light and therefore appear colorless to the eye in the absence of UV radiation, and therefore do not influence the color of the coating. However, in particular embodiments it can be envisaged that the fluorophore is visible with the naked eye.

Typically, the emission wavelength ranges between 100 and 1000 nm. In particular embodiments, the light emitted by the fluorophore is visible light, i.e. the emission wavelength ranges between about 380 nm to about 740 nm. This allows a simple visual check of the coating quality.

The fluorophore may further be selected based on its fluorescence quantum yield and/or photostability. Preferably, the fluorophore absorbs and emits light with high efficiency (i.e., has a high molar absorption coefficient and a high fluorescence quantum yield) at the excitation wavelength used. This reduces the amount of fluorophore required for accurate monitoring of the coating process. Preferably, the fluorophore is photostable. This means that the fluorophore does not undergo significant degradation upon light excitation within the time necessary for the process for characterization of the coating as described further in this text.

In particular embodiments, the fluorophore used in the methods described herein is a compound, more particularly an organic compound. Indeed, although organic compounds introduced into a plasma (or afterglow region thereof) typically form reactive species, for example through fragmentation reactions, it has surprisingly been found that organic fluorophores may be incorporated in plasma coatings, without significant loss of their fluorescence properties.

Additionally or alternatively, the fluorophore may comprise fluorescent nanoparticles, for example inorganic nanocrystals.

In particular embodiments, the fluorophore is selected from a fluorescent protein (such as EGFP, EYFP, DsRed, ZsGreen, ZsYellow, or HcRed), a xanthene derivative (such as fluorescein dyes, rhodamine dyes, Oregon green, eosin dyes, and Texas red), a benzoxazole derivative (such as fluorescent brightener 184), a cyanine derivative (such as cyanine, indocarbocyanine, oxacarbocyanine, thiacarbocyanine and merocyanine), napthhalene or a naphthalene derivative (such as dansyl and prodan), anthracene or an anthracene derivative, coumarin or a coumarin derivative, an oxadiazole derivative (such as pyridyloxazole, nitrobenzoxadiazole and benzoxadiazole), a pyrene derivative (such as cascade blue), an oxazine derivative (such as nile red, nile blue, cresyl violet and oxazine 170), an acridine derivative (such as proflavin, acridine orange and acridine yellow), an arylmethine derivative (such as auramine, crystal violet and malachite green), a tetrapyrrole derivative (such as porphin, phtalocyanine and bilirubin) and a diene derivative (such as 1-3-butadiene).

In certain embodiments, the fluorophore is selected from rhodamine 6G, rhodamine WT, fluorescein, fluorescent brightener 184 (2,5-Bis(5-tert-butyl-2-benzoxazolyl) thiophene), Keyplast FL yellow R, 1,3-butadiene, naphthalene and anthracene.

In particular embodiments, the fluorophore is comprised in a solution, whereby in the methods, said solution is introduced into the plasma (or afterglow thereof) in the form of an aerosol together with a carrier gas. This can be together or independently from the coating precursor(s). Thus, in further embodiments, one or more coating precursors and one or more fluorophores are comprised in a (single) solution, whereby said solution is introduced into said plasma (or afterglow thereof) in the form of an aerosol together with a carrier gas. In yet further embodiments, the one or more fluorophore(s) are dissolved in the one or more coating precursors. Alternatively, the coating precursor(s) and/or fluorophore(s) may also be introduced into the plasma (or afterglow thereof) as a gas or a vapor.

The carrier gas is typically a gas suitable for generating and maintaining a (DBD) plasma. In particular embodiments, the carrier gas is selected from $N_2$, Ar, He, $CO_2$, $O_2$, $N_2O$, $CF_4$, $SF_6$ or a mixture of two or more of these gases. In certain embodiments, the carrier gas is $N_2$. Among inert gasses, nitrogen is a relatively inexpensive plasma gas.

In particular embodiments of the methods envisaged herein, the solution comprising the fluorophore(s) is introduced in the plasma (or afterglow thereof) as an aerosol comprises particles or droplets with an average diameter between 30 and 70 nm. In certain embodiments, at least 80%, 90% or more of the particles or droplets has a size between 10 and 200 nm. The aerosol may be generated in any suitable aerosol generator or atomizer, such as ultrasonic nebulizers, bubblers or electrospraying techniques.

If a fluorophore is comprised in a solution as described above, the preferred minimal and maximal fluorophore concentration in the solution may depend on various factors such as the fluorophore solubility, the envisaged coating thickness, the envisaged coating color, the method for monitoring the fluorescence, the fluorescence quantum yield, etc. The fluorophore concentration in the solution is preferably sufficiently high to allow a visible monitoring of the coating quality via the emitted fluorescence. As the coatings deposited by the methods described herein are generally thin coatings, the concentration of the fluorophore in solution is often as high as possible, i.e. close to saturation. Saturation is the point of maximal concentration at which the solution can dissolve no more of the fluorophore and any additional amounts appear as a separate phase, such as a precipitate. The concentration at saturation may be pressure and temperature dependent. Typically, the reference temperature and the reference pressure are close to the temperature and pressure at which the solution is stored. Typically, this implies a reference temperature between $-15°$ C. and $25°$ C., for example $20°$ C., and a reference pressure around 100 kPa. In particular embodiments, the solution comprises the fluorophore(s) in a concentration ranging between 10% and 100% of the fluorophore concentration at saturation. Practically, this often results in a solution which comprises the one or more fluorophores in a concentration between 0.1 and 10 mM (millimolar).

The processes described herein allow for the deposition and characterization of very thin coatings compared to other coating techniques such as plasma spraying. In particular embodiments, the coating has an average thickness between 0.1 and 500 nm, more particularly between 0.1 and 100 nm, for example between 0.2 and 20 nm.

As the coatings obtained by the deposition process as described herein comprise one or more fluorophores, the coatings may be characterized by monitoring the fluorescence of the fluorophore in the coating.

Accordingly, processes are envisaged herein for providing a plasma coating on a substrate which comprise characterizing the coating on the substrate and methods for characterizing a plasma coating on a substrate, whereby the plasma coating is obtained as described above.

More particularly, the deposition of the plasma coating and the characterization is performed in-line, i.e. as part of a continuous process, as will be detailed below. More particularly, the methods for coating and/or characterizing a plasma coating may comprise the steps of:
 a) exposing the substrate to a non-thermal plasma (or an afterglow region thereof), said plasma (or said afterglow) comprising at least one coating precursor and one or more fluorophore(s) other than the coating precursor(s), thereby obtaining a coated substrate wherein the coating of the coated substrate comprises the fluorophore(s);
 b) irradiating the coated substrate in-line with electromagnetic radiation suitable for exciting the fluorophore(s); and
 c) monitoring the light emitted from the fluorophore(s) present in the coating in line with the coating process so as to characterize the coating.

These steps will be detailed below.

The step referred to under (a) above corresponds to the process for deposition of a plasma coating on a substrate as described above, and is typically performed in a dedicated plasma reactor. Typically, the plasma reactor allows for a continuous coating process. For example, the plasma reactor may be a dielectric barrier discharge reactor. Accordingly, the methods involve depositing a plasma coating comprising one or more fluorophores on a substrate.

In a next step, corresponding to step (b) described above, the coated substrate is irradiated with electromagnetic radiation suitable for exciting the one or more fluorophores incorporated in the coating.

The wavelength or wavelength range of the electromagnetic radiation applied in this step depends on the excitation wavelength range of the fluorophore(s) used in the coating step. Examples of suitable fluorophores and their excitation wavelengths are described above. Thus, typically, the electromagnetic radiation has one or more wavelengths between 10 and 1000 nm, more particularly between 100 and 800 nm. In particular embodiments, the excitation wavelength used in the irradiation step ranges between 100 and 400 nm. In preferred embodiments, the electromagnetic radiation has one or more wavelengths at or near the wavelength at which the absorbance spectrum of the fluorophore(s) (between 10 and 1000 nm) shows a maximum.

Irradiation of the coated substrate is typically performed with an irradiation source such as an arc lamp, gas-discharge lamp, a fluorescent tube, an incandescent lamp, a light emitting diode, etc. The light emitted from the irradiation source may be filtered for filtering out certain wavelength ranges.

The irradiation source may be part of an irradiation unit comprising two or more irradiation sources emitting at varying wavelengths or wavelength ranges. Depending on certain parameters such as the fluorophore excitation wavelength(s), one or more irradiation sources of the irradiation unit may be selected for irradiation of the coated substrate. In a continuous process, the irradiation source is typically positioned downstream of at least one plasma reactor, thus allowing an in-line irradiation and monitoring of the coating. If more than one plasma reactor is used in the continuous coating process, also more than one irradiation source may be used. For example, the substrate may be irradiated each time it has moved through a plasma reactor.

When the plasma coating is irradiated with the suitable wavelength, the fluorophore emits fluorescence light. By monitoring the light emitted from the one or more fluorophores present in the coating, it is possible to characterize the coating. More particularly, as the fluorophores is incorporated during the coating, the characterization can be performed directly after the coating, in the production environment. More particularly it allows for the in-line characterization of various aspects of the coating, and thus for an in-line quality control. Accordingly, a further step of the processes for characterizing a plasma coating on a substrate as described herein comprises the monitoring of the light emitted from the coating. It is noted that this further step can be performed essentially simultaneously (and physically in the same environment) with the irradiation step.

For example, the coating homogeneity may be monitored by monitoring the fluorescence intensity. In particular embodiments, this may be a simple visual check. For example, an operator may check for abnormally light or dark regions in the coating. Typically, for this purpose, the operator is positioned in the vicinity of the coated substrate near the irradiation source(s), so as to be able to see the light emitted by the coating. Additionally or alternatively, the fluorescence intensity and/or homogeneity may be quantified after detection with a detector. For this purpose, the detector is positioned in the vicinity of the coated substrate near the irradiation source(s), so as to be able to capture light emitted by the substrate and optionally capture the entire surface of the coated substrate. More particularly, the detector is placed in-line with the plasma reactor.

Thus, in particular embodiments, the light emitted from the fluorophore(s) is monitored qualitatively and/or measured quantitatively.

When the intensity is measured quantitatively, a minimum and/or maximum allowable intensity may be set, in between which the coating is considered conform to the required specifications. Additionally or alternatively, a maximal allowable variation in intensity between adjacent regions may be set. Furthermore, the system may be calibrated such that the coating thickness can be measured via the fluorescence intensity. Accordingly, in particular embodiments, the step of monitoring the emitted light from the coating in the methods envisaged herein comprises characterizing at least one property of said coating selected from the coating thickness and coating homogeneity. It is not required that the detector detects all the light emitted by the fluorophore(s). For example, the detector may only detect radiation in a wavelength range wherein most emission of the fluorophore occurs (i.e. near wavelength corresponding with the maximum in the emission spectrum of the fluorophore).

In particular embodiments, processes for depositing a plasma coating on a substrate and/or the processes for characterizing a plasma coating on a substrate are continuous processes, i.e. not batch processes. Continuous processes typically are faster and more efficient than batch processes and are therefore particularly desirable for industrial applications. In particular embodiments, the continuous process implies that the substrate moves through the plasma (see further).

Thus, the processes described herein typically allow for a fast coating of a substrate and the in-line characterization of the coated substrate.

The term "in-line" or "inline" when referring to a step in the process described herein, is understood to mean a step which takes place at the same time as another step of the process, or after another step of the process without any appreciable delay. In other words, the substrate is subjected to the steps of the process without any intermediate storing of the substrate or only with marginal or negligible intermediate storing of the produced carrier material. In the context of a continuous process, the term "in-line", such as an in-line characterization, implies that the characterization also is part of the continuous process. In certain embodiments, the processes described herein are continuous plasma treatment processes as described in patent application WO 2012/004175, which is hereby incorporated by reference. Thus, typically, after passing through the plasma, a portion of the coating is irradiated systematically as the substrate comes out of the plasma. The coating and irradiation are sequential operations whereby the substrate is typically moved through the plasma and thereafter moved through the irradiation unit thereafter, in a continuous way.

In particular embodiments of the processes for depositing a plasma coating on a substrate and/or the processes for characterizing a plasma coating as described herein, the substrate may move through the plasma (or afterglow thereof) at a speed up to 500 meter per minute. As higher speeds generally result in thinner coatings, the substrate speed influences the plasma treatment time and therefore the thickness of the coating deposited by the process. In particular embodiments, the substrate travels through the plasma (or afterglow) with a speed between 1 and 500 meter per minute, such as between 5 and 100 meter/minute, for example between 5 and 50 meter per minute.

In particular embodiments of the processes for depositing a plasma coating on a substrate and/or the processes for characterizing a plasma coating as described herein, the substrate may be exposed several times to a plasma (or afterglow) comprising one or more coating precursor(s) and fluorophore(s). In certain embodiments, the substrate is exposed several times to similar plasmas, i.e. comprising the same coating precursor(s) and fluorophore(s). This may be done to increase the plasma treatment time (and thereby obtaining a thicker coating), without the need of slowing down the process. In other embodiments, the substrate is exposed to two or more different plasmas, i.e. comprising different coating (precursors(s) and/or fluorophore(s), thereby obtaining a composite coating. In certain embodiments, the two or more different plasmas comprise a different fluorophore, preferably with non-overlapping fluorescence emission wavelengths. In this way, the characterization of the last coating layer is not hindered by interfering luminescence from the previous coating layers. Moreover, this means that if the coating layers are sufficiently transparent to the excitation and emission light, all coating layers may be characterized simultaneously.

In certain embodiments, the obtained coating is characterized by irradiating the coating and monitoring the fluorescence after each exposure of the substrate to a plasma. This enables stopping or skipping of all other steps of the process as soon as a problem during one of the coating steps is detected.

In a further aspect, the coated substrates obtained by the deposition processes described herein are provided. The coating layer of the coated substrates comprises a fluorophore incorporated therein. In particular embodiments, the coating has an average thickness between 0.1 and 500 nm, more particularly between 0.1 and 100 nm, for example between 0.2 and 20 nm. Most particularly, the coating comprises a homogenously distributed fluorophores. In further particular embodiments, the coating is transparent, more particularly optically transparent. The term "optically transparent" as used herein means having the property of transmitting at least 70%, preferably at least 80, 90, 95 or 99%, of the incident visible light (electromagnetic radiation with a wavelength between 400 and 760 nm) without diffusing it. The transmission of visible light, and therefore the transparency, can be measured using a UV-Vis Spectrophotometer as known to the person skilled in the art. For the transmission measurement, the coating may be deposited on a substantially transparent reference substrate such as a standard glass microscopy slide.

In line with the above, the use of a fluorophore for in-line characterization of a coating obtained by plasma deposition is also provided. In particular embodiments, the use as envisaged herein comprising:
  incorporating the fluorophore in the coating;
  irradiating the coating (in-line) with electromagnetic radiation suitable for exciting the fluorophore; and
  monitoring the light emitted from the fluorophore.

In particular embodiments, the plasma coating process is a continuous process and the characterization of the coating by monitoring the light emitted from the fluorophore is performed in-line with the coating process.

The following examples are provided for the purpose of illustrating the claimed subject matter but by no means are meant and in no way should be interpreted to limit the scope of the claims.

EXAMPLES

In the following examples it is demonstrated that the incorporation of fluorescent groups during plasma deposition can be used for characterizing the coating.

a) Setup for the Plasma Deposition

FIG. 1A illustrates an exemplary DBD plasma reactor suitable for plasma deposition at atmospheric pressure. Two plasmas (1, 1') are generated and maintained between two top electrodes (2) and a bottom electrode (2'). The top and bottom electrodes are parallel. All electrodes are made of stainless steel and are covered with isolating glass plates (3). The electrodes are typically water-cooled (not shown) to prevent overheating. The gap between the glass plates covering the top and bottom electrodes is about 2 mm. The substrate (4), for example a polymer foil, is positioned on the (grounded) bottom electrode (2'). The carrier gas, for example $N_2$, is introduced in an opening between the top electrodes (2), together with the coating precursor(s) and fluorophore(s) as an aerosol (5). The aerosol is generated in an atomizer (not shown), which generates aerosol droplets with a size ranging between 10 and 200 nm and an average size of about 50 nm. In the reactive plasma, the coating precursor(s) react and may polymerize and are deposited on the substrate together with the fluorophore(s), thus forming a fluorescent coating (not shown).

In an industrial process, the substrate may be mounted on rollers (or positioned on a conveyor belt) and be moved through the plasma at a speed up to 500 meter per minute. Alternatively, the electrodes may move relative to each other.

In the configuration as illustrated in FIG. 1A, the first plasma (1) may be used for cleaning and/or activating the substrate surface, whereas the second plasma (1') is used for the actual coating process.

FIG. 1B illustrates an alternative exemplary DBD plasma reactor suitable for plasma deposition at atmospheric pressure. The plasma (1) is generated and maintained between two stainless steel electrodes, more particularly a high-voltage electrode (2) and a grounded electrode (2'). The electrodes are covered with isolating glass plates (3). The substrate (4) is positioned at such a distance of the electrodes that the substrate is in an afterglow region (7) of the plasma which is generated and maintained between the electrodes. In this configuration, the gap between the afterglow expulsion of the jet and the substrate may vary between 1 mm and 100 mm, more preferentially between 2 and 10 mm. The carrier gas (6), for example $N_2$, is introduced at the top of the plasma jet, while the coating precursor(s) and fluorophore(s) are introduced as an aerosol in the afterglow region (7). In the reactive afterglow, the coating precursor(s) react and may polymerize; they are deposited on the substrate, together with the fluorophore(s), thus forming a fluorescent coating (not shown).

b) Tests with Various Fluorophores and Coating Precursors

The inventors have tested various combinations of fluorophores and coating precursors for use in plasma coating depositioning experiments. Rhodamine 6G, fluorescein, fluorescent brightener 184 and Keyplast FL yellow R, 1,3-butadiene, naphthalene and anthracene were tested as fluorophores. Rhodamine 6G, fluorescein, fluorescent brightener 184 and Keyplast FL yellow R are dyes which mainly absorb visible light, whereas 1,3-butadiene, naphthalene and anthracene are UV-active compounds. As plasma coating precursors, ethanol, acrylic acid, 3-glycidoxypropyltrimethoxysilane (GLYMO) and a siloxane-based hydrolyzed solution were tested. As substrates, glass and a low-density polyethylene coated paper were used.

The coating experiments were performed using a Plasma-Zone® setup developed by VITO NV, Belgium. This is a DBD setup comprising two parallel electrodes. The top electrode is smaller than the bottom electrode and moves relative to the bottom electrode, while the distance between the electrodes remains constant. The substrate is inserted in the space between the two electrodes. A plasma was generated and maintained by applying a total nitrogen gas ($N_2$) flow (between 20 and 40 slm), an AC frequency between 1.5 and 40 kHz and a power varying from 0.2 to 0.8 W/cm² electrode surface.

Typically, the top electrode moved with a speed of 8 meter per minute, which corresponds with a plasma treatment time of about 5.4 seconds. The plasma treatment was repeated up to 40 times, such that the plasma treatment time typically varied between 5.4 and 216 seconds.

For coating, various solutions containing one fluorophore and one coating precursor were prepared. Thus, the fluorophores were dissolved in the coating precursor. In most experiments, the concentration of the fluorophore in solution was close to saturation. Some concentrations at saturation are given in Table 1. The solutions were atomized and the resulting aerosol was introduced in the plasma together with the carrier gas. In all experiments described herein, nitrogen gas ($N_2$) was used as carrier gas.

TABLE 1 maximal concentrations (g/L) of various fluorophores in the tested coating precursors

|  | ethanol | acrylic acid | GLYMO | siloxane-based hydrolyzed solution |
|---|---|---|---|---|
| rhodamine 6G | 1.11 | 3.00 | 0.30 | 3.10 |
| fluorescein | 0.56 | 0.75 | 0.08 | 1.07 |
| fluorescent brightener 184 | 0.53 | 1.30 | 1.00 | 0.29 |
| Keyplast FL yellow R | 0.55 | 1.40 | 2.00 | 1.13 |

X-ray photoelectron spectrometry (XPS) and Infrared (IR) spectroscopy measurements have indicated that the coating was formed comprising the polymerized coating precursors. The obtained coatings were further characterized via profilometry measurements. In most cases, the signals in the IR spectra attributable to the fluorophores were weak and not reliable for obtaining quantitative data. However, the presence of the fluorophores in the coatings was confirmed via fluorescence microscopy. Thus, the fluorophores were incorporated in the coatings, while the fluorescence properties remained intact.

The inventors found that at a power of 0.8 W/cm², the plasma generally provided sufficient reactivity to obtain a hardened coating. In certain cases, a lower power, such as 0.5 or 0.2 W/cm² was found to be insufficient to provide good quality coatings. It was further found that the coatings obtained using a frequency of 1.5 kHz are generally more homogeneous than the coatings obtained at 40 kHz, because the plasma itself exhibits less filamentation at 1.5 kHz.

The best results were obtained using acrylic acid and siloxane-based hydrolyzed solution as a precursor, which are compatible with all tested fluorophores. Particularly good results were obtained with fluorescein dissolved in acrylic acid, which enables a high growth speed (about 137 nm/min) during coating. For the UV-active fluorophores, naphthalene gave the best results.

The above small scale testing demonstrates that the concept is applicable to different types of fluorophores and thus that the envisaged methods and products are not limited to specific fluorophores.

c) Fluorescence Tests

Figure 2:
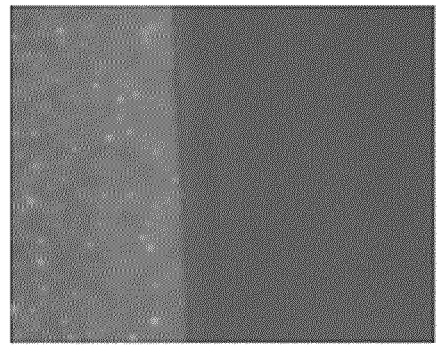
FIG. 2A, B: fluorescence microscopy images of glass substrates partially coated via processes according to particular embodiments of the methods envisaged herein.
Figure 2:
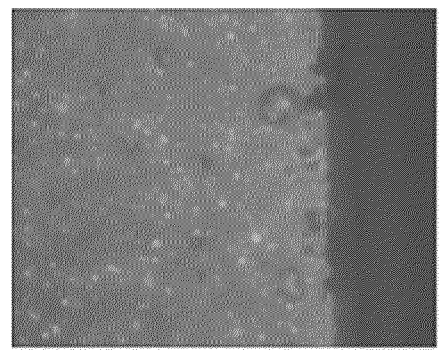

FIGS. 2A and 2B show fluorescence microscopy images of two glass substrates which were partially coated via the process according to particular embodiments described herein. Both figures represent an area of about 1.1×1.4 mm of the substrates. The coatings were deposited on a glass substrate which was partially covered with a mask. The mask was removed after coating. Thus, the coating was only applied on the non-masked area. FIGS. 2A and 2B clearly show the difference between the coated (light) and non-coated (dark) regions of the substrates, thus demonstrating that the fluorescence can be used for characterizing the coatings.

Both coatings are obtained in a DBD reactor as shown in FIG. 1A. The coating in FIG. 2A was obtained using a solution of rhodamine 6G in acrylic acid. The rhodamine 6G concentration was 1.68 g/L, the applied frequency was 1.5 kHz, the nitrogen gas flow was 2 slm and the applied power was 0.8 W/cm². The total plasma treatment time was 54 seconds and the average thickness of the coating was 87 nm.

The coating in FIG. 2B was obtained using a solution of rhodamine 6G in acrylic acid. The rhodamine 6G concentration was 0.44 g/L, the applied frequency was 1.5 kHz, the nitrogen gas flow was 2 slm and the applied power was 0.8

W/cm². The total plasma treatment time was 108 seconds and the average thickness of the coating was 158 nm.

What is claimed is:

1. A process for characterizing a coating obtained via a plasma treatment or a plasma deposition process on a substrate, wherein said plasma is a dielectric barrier discharge (DBD), whereby an organic fluorophore is incorporated in said coating and wherein said coating is characterized by monitoring the fluorescence of said organic fluorophore.

2. The process according to claim 1, comprising the steps of:
    a) exposing said substrate to a dielectric barrier discharge (DBD) or an afterglow region of said DBD, said DBD or afterglow comprising at least one coating precursor and one organic fluorophore other than said coating precursor, thereby obtaining a coated substrate wherein the coating of said coated substrate comprises said fluorophore;
    b) irradiating said coated substrate in-line with electromagnetic radiation suitable for exciting said fluorophore; and
    c) monitoring the light emitted from said fluorophore present in said coating in-line with the coating process so as to characterize said coating.

3. The process according to claim 1, wherein said process is a continuous process.

4. The process according to claim 1, wherein said coating precursor and fluorophore are comprised in a solution, said solution being introduced into said dielectric barrier discharge or said afterglow in the form of an aerosol together with a carrier gas.

5. The process according to claim 3, wherein said solution comprises said fluorophore in a concentration ranging between 10% and 100% of the concentration at saturation.

6. The process according to claim 1, wherein step c) comprises characterizing at least one property of said coating selected from the coating thickness and coating homogeneity.

7. The process according to claim 1, wherein the light emitted from said fluorophore is monitored visually or measured quantitatively.

8. The process according to claim 1, wherein said fluorophore is selected from a fluorescent protein, a xanthene derivative, a cyanine derivative, anthracene or an anthracene derivative, napththalene or a naphthalene derivative, coumarin or a coumarin derivative, an oxadiazole derivative, a pyrene derivative, an oxazine derivative, an acridine derivative, an arylmethine derivative, a tetrapyrrole derivative, and a diene derivative.

9. The process according to claim 1, further comprising an activation step prior to step a), said activation step comprising the introduction of said substrate in a plasma or in an afterglow region thereof, said plasma or afterglow not comprising said coating precursor and fluorophore.

10. The process according to claim 1, wherein said plasma is maintained at a pressure between 10 kPa to 1 MPa.

11. The process according to claim 1, wherein said plasma is a dielectric barrier discharge generated and maintained in the volumetric space between a first and second electrode by applying an alternating voltage to said first and second electrode.

12. The process according to claim 1, wherein said substrate moves through said dielectric barrier discharge or an afterglow thereof at a speed up to 500 meter per minute.

13. The process according to claim 1, wherein said electromagnetic radiation has one or more wavelengths between 100 and 800 nm.

14. A process for deposition of a coating obtained via a plasma treatment or a plasma deposition process on a substrate, comprising the step of exposing said substrate to a dielectric barrier discharge (DBD) or an afterglow region of said DBD comprising at least one coating precursor and one organic fluorophore other than said coating precursor, thereby obtaining a coated substrate wherein the coating of said coated substrate comprises said fluorophore.

* * * * *